United States Patent [19]
Pfeifer et al.

[11] Patent Number: 4,872,129
[45] Date of Patent: Oct. 3, 1989

[54] DIGITAL DECIMATION FILTER

[75] Inventors: Heinrich Pfeifer, Denzlingen; Werner Reich, Emmendingen; Martin Winterer, Freiburg, all of Fed. Rep. of Germany

[73] Assignee: Deutsche ITT Industries, GmbH, Freiburg, Fed. Rep. of Germany

[21] Appl. No.: 272,968

[22] Filed: Nov. 18, 1988

[30] Foreign Application Priority Data

Dec. 12, 1987 [EP] European Pat. Off. ........ 87118434.7

[51] Int. Cl.$^4$ ............................................. G06F 15/31
[52] U.S. Cl. ................................................. 364/724.1
[58] Field of Search .......................... 364/724.1, 724.17

[56] References Cited

U.S. PATENT DOCUMENTS

4,356,559 10/1982 Candy et al. ..................... 364/724.1

OTHER PUBLICATIONS

IEEE Transactions on Acoustics, Speech and Signal Processing, vol. ASSP-29, No. 2, Apr. 1981, pp. 155-162, Hogenauer: "An Economical Class of Digital Filters for Decimation and Interpolation".
IEEE Tranactions on Circuits and Systems, vol. CA-S-31, No. 11, Nov. 1984, pp. 913-924, Chu et al.: "Multirate Filter Designs Using Comb Filters".

Primary Examiner—Gary V. Harkcom
Assistant Examiner—Tan V. Mai
Attorney, Agent, or Firm—Thomas L. Peterson

[57] ABSTRACT

To realize the transfer function in a digital filter circuit:

$$H(z)=b(1-z^{-kn})(1-z^{-n})^{m-1}/(1-z^{-})^m,$$

the following sections are cascaded: a multiplier for multiplying by $2^{-q}$; $m-1$ integrators, each including a delay element which provides a delay equal to the period of the input sampling frequency; and mth integrator including a delay element which is reset by the output sampling clock; a sampling device which is switched at the output sampling clock rate; $m-2$ differentiators, each including a delay element which provides a delay equal to the period of the output sampling clock; and an $(m-1)$st differentiator including k delay elements which each provide a delay equal to the period of the output sampling clock.

7 Claims, 1 Drawing Sheet

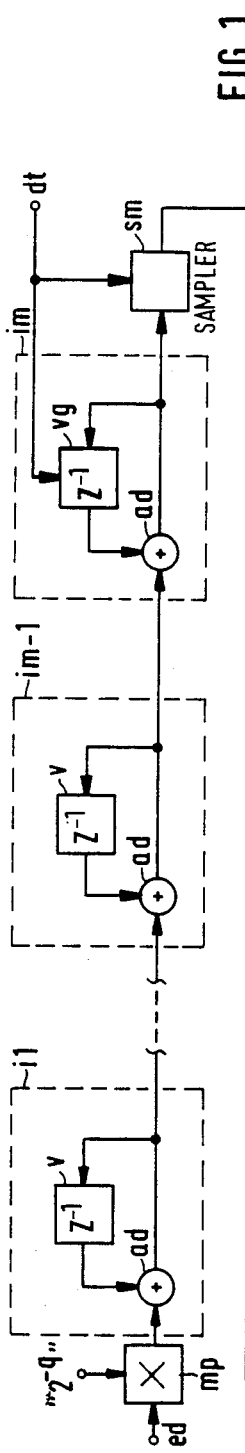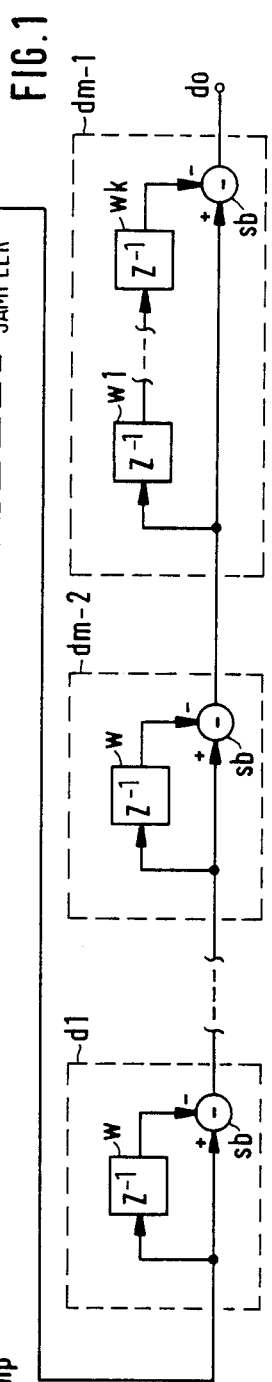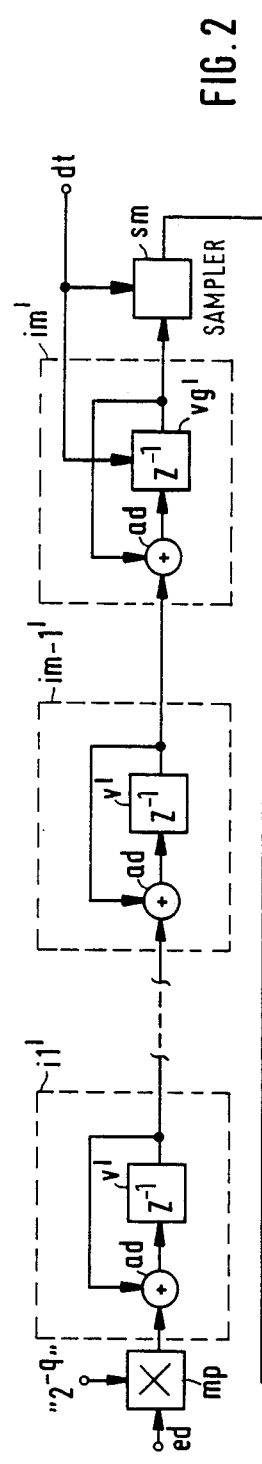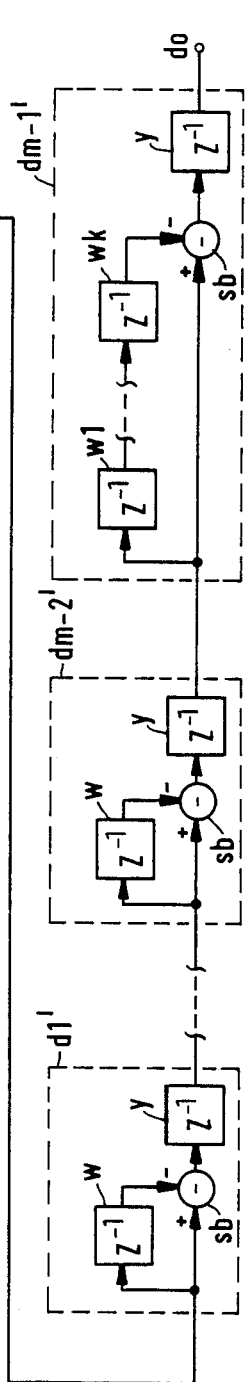
FIG.1  FIG.2

DIGITAL DECIMATION FILTER

BACKGROUND OF THE INVENTION

1. Field of the Invention

The present invention is in the field of digital filters, and, more particularly, in the field of digital decimation filters wherein an input is sampled at a first frequency and a filtered output is provided at a second frequency lower than the first frequency.

2. Description of the Related Art

In digital systems, it is frequently necessary to change from a predetermined input sampling frequency, at which the digital data to be processed occur, to a lower output sampling frequency. In the literature, this is referred to as "decimation". It consists of two steps: filtering and subsequent down-sampling. The fact that, because of the down-sampling, not each of the output data of the decimation filter is needed, permits a simplification of the filter structure. In many digital systems, particularly in connection with so-called oversampling analog-to-digital converters (where the sampling frequency is higher than it would have to be in accordance with the sampling theorem), a cascade of several moving-time averagers is used as the decimation filter. The transfer function of the decimation filter is:

$$H(z) = b(1 + z^{-1} + \ldots + z^{-n+1})^m \quad (1)$$
$$= b(1 - z^{-n})^m/(1 - z^{-1})^m,$$

where n is the integral quotient of the input sampling frequency r of the input data and the output sampling frequency d of the output data, m is a number which specifies how many sections are cascaded, b is a multiplication factor, and z is the complex frequency variable.

A decimation filter generalized by an integral parameter k greater than or equal to one makes it possible to vary the bandwidth as a function of k; the transfer function is then:

$$H(z) = b(1 + z^{-1} + \ldots + z^{-kn+1})(1 + z^{-1} + \ldots + z^{-n+1})^{m-1} \quad (2)$$
$$= b(1 - z^{-kn})(1 - z^{-n})^{m-1}/(1 - z^{-1})^m.$$

This transfer function has at least simple zeros (corresponding to infinite attenuation) at frequencies which are an integral multiple of d/k, and m-fold zeros at multiples of d. If the two's complement notation of binary numbers is used in the realization of a decimal filter with the latter transfer function (2), no limitation of generality follows from the interpretation that the binary numbers are only numbers in the range between −1 and +1. The decimation filter is definitely not overloaded if the condition b less than or equal to $1/kn^m$ is satisfied.

Since the transfer function H(z) can be written as a product of two or more factors, a multiplicity of different decimation-filter circuits for realizing the transfer function are obtained according to the order of the factors. Of particular interest are realizations which require a minimum circuitry, i.e., which take up as little chip area as possible if the filter circuit is implemented as a monolithic integrated circuit.

SUMMARY OF THE INVENTION

Accordingly, the object of the invention as claimed is to provide a circuit arrangement for the transfer function (2) above which is particularly advantageous from the points of view mentioned above.

BRIEF DESCRIPTION OF THE DRAWINGS

The invention will now be explained in greater detail with reference to the accompanying drawings, in which:

FIG. 1 is a highly schematic block diagram of the decimation-filter circuit according to the invention; and FIG. 2 is a highly schematic block diagram of a modification or development of the arrangement of FIG. 1.

DETAILED DESCRIPTION OF THE PREFERRED EMBODIMENT

In the present invention, the above-mentioned no-overload condition is implemented by choosing that power of $2^{-q}$ for b which is either equal to the quotient $1/kn^m$, if the latter is a power of two, or which is the smaller power of two closest to this quotient.

Accordingly, in FIG. 1, the first element of the digital filter circuit is a multiplier mp, one input of which is fed with the input data to be decimated, ed, and the other input of which is fed with a digital word representing a power of two, i.e., the digital word "$2^{-q}$". The output of the multiplier mp is followed by m−1 integrators, of which the first and last integrators i1 and im−1 are shown in FIG. 1. Each of the integrators i1 . . . im−1 comprises an adder ad, which is connected between the input and the output of the integrator, and a delay element v, which is connected between the output of the integrator and an input of the adder ad. The delay element v introduces a delay equal to the period of the input sampling frequency r of the input data ed. Each of the adders ad thus has two inputs, one of which is connected to the output of the multiplier mp (in the case of the adder ad in the first integrator i1) or to the output of the preceding integrator (in the cases of the adders in the following integrators). The other input of each adder ad is connected to the output of the respective delay element v.

The next-to-last integrator im−1 is followed by a last integrator im, whose internal circuitry is basically identical to that of the other integrators, but in which a delay element vg replaces the delay element v of the other integrators. The delay element vg is reset by the output sampling clock dt. Thus, the sum output of the last integrator im is reset once during each period of the output sampling clock dt, preferably at the beginning of each period.

The output of the last integrator im is followed by a sampling device sm, which is controlled by the output sampling clock dt and, thus, causes a decimation of the data rate. The sampling device sm is followed by a chain of m−1 differentiators d1 . . . dm−2, dm−1, the first m−2 of which are identical in construction. Interposed between the input and the output of each of the differentiators d1 . . . dm−2 is the minuend-input-to-output path of a respective subtracter sb, whose subtrahend input is connected to the output of a delay element w, which provides a delay equal to the period of the output sampling clock dt. The input of the delay element w in each differentiator is connected to the input of the differentiator.

The last differentiator dm−1, whose output provides the decimated output data do, contains the series arrangement of k delay elements w1 ... wk instead of the single delay element w in the m−2 first differentiators d1 ... dm−2. Each of the delay elements w1 ... wk introduces a delay equal to the period of the output sampling clock dt.

From the above-mentioned multiplication by the power of two, i.e., $2^{-q}$ it follows that the signals to be processed in the digital filter circuit contain p+q bits, where p is the number of bits in the input data ed.

On superficial inspection, the invention appears impractical, because at the input of the decimation-filter circuit, there is a cascade of digital integrators, so that an arbitrarily small DC signal at the input results in an overflow of the integrators. However, this must be permitted in the invention and surprisingly does not result in a malfunction, because the overflow of the integrators is fully compensated for by the overflow of the subtracters in the differentiators. Therefore, the overflow must not be suppressed.

FIG. 2 shows a modification or development of the arrangement of FIG. 1 with which any time or speed problems can be solved that may arise from the fact that the output signals from the adders and subtracters are needed in subsequent adders and subtracters, respectively, before the end of the same period of the input frequency and the output frequency, respectively. This problem is solved by providing additional delay elements at suitable points.

In the arrangement of FIG. 2, therefore, each of the differentiators d1′, dm−2′, dm−1′ contains an additional delay element y, which introduces a delay equal to the period of the output sampling clock dt and is connected between the output of the subtracter sb and the output of the respective differentiator.

An additional delay element, which would have to be connected ahead of the output of each of the integrators i1, im−1 of FIG. 1, can be united with the existing delay element v if the order of the adder ad and the delay element v′ is chosen as shown in FIG. 2. The adder ad and the delay element v′ of FIG. 2 are connected in series, so that unlike the integrators of FIG. 1, where the output of the adder ad is fed back to the adder ad delayed, the output of the delay element v′ is fed back to the adder ad in FIG. 2. The last integrator im′ contains a resettable delay element vg′. The adder ad and the delay element vg′ are connected in series within the last integrator im′, and the output of the delay element vg′ is fed back to the adder ad.

In the arrangement of FIG. 2, it is thus ensured that each adder and subtracter has one complete period of the input data clock and the output data clock, respectively, to deliver the output signal.

We claim:

1. A digital filter circuit for implementing a decimation filter with the transfer function:

$$H(z) = b(1-z^{-kn})(1-z^{-n})^{m-1}/(1-z^{-1})^m,$$

where z is the complex frequency variable, k is an integral parameter for adjusting the bandwidth of the digital filter circuit, m is a number which specifies how many filter sections are cascaded, n is the integral quotient of the input sampling frequency of the input data and the output sampling frequency of the output data, and b is the nearest power of two ("$2^{-q}$") less than or equal to $1/kn^m$, with terms of the form $(1-z^{-n})$ and $(1-z^{-kn})$ representing differentiators, and terms of the form $(1-z^{-1})$ representing integrators, the digital filter circuit comprising a cascade arrangement of the following sections:

a multiplier that receives an input signal to be filtered and that multiples the input signal by the factor $2^{-q}$;

m−1 integrators, each of the integrators having an input and an output and comprising:

an adder having first and second inputs and a sum output, the adder in each integrator having its first input and its sum output interposed between the input and the output of the integrator; and a delay element having an input and an output, the input of the delay element connected to the output of the adder in the integrator and the output of the delay element connected to the second input of the adder, the delay element introducing a delay equal to the period of the input sampling frequency;

an mth integrator having an input and an output, the mth integrator comprising:

an adder having first and second inputs and a sum output, the adder having its first input and its sum output interposed between the input and the output of the integrator; and a delay element having an input and an output, the input of the delay element connected to the output of the adder and the output of the delay element connected to the second input of the adder, the delay element introducing a delay equal to the period of the input sampling frequency, the delay element being reset by the output sampling clock to thereby reset the sum;

a sampling device switched at the pulse repetition rate of the output sampling clock;

m−2 differentiators each containing a delay element which introduces a delay equal to the period of the output sampling clock; and an (m−1)st differentiator containing k delay elements which each introduce a delay equal to the period of the output sampling clock.

2. A digital filter circuit as claimed in claim 1, comprising an additional delay element in each of the differentiators which is connected ahead of the output of the respective differentiator and introduces a delay equal to the period of the output sampling clock.

3. A digital filter circuit as defined in claim 2, wherein:

in each of the m−1 integrators the adder and the delay element are connected in series between the input and the output of the integrator, with the output of the delay element fed back to the input of the adder; and in the mth integrator, the adder and the resettable delay element are connected in series between the input and the output of the integrator, with the output of the resettable delay element fed back to the adder.

4. A digital filter as defined in claim 2, wherein each of said differentiators includes a subtracter having a subtrahend input, a minuend input and an output, the minuend input of each subtracter connected to the input of the respective differentiator, the subtrahend input of each subtracter connected to the output of the respective delay element in the differentiator, and the output of each the subtracter connected to the input of the additional delay element in the differentiator.

5. A digital filter circuit as defined in claim 1, wherein the delay element in each of the integrators has its input connected to the output of the integrator.

6. A digital filter circuit as defined in claim 1, wherein the sum output of the adder in each integrator is connected directly to the output of the integrator.

7. A digital filter as defined in claim 1, wherein each of said differentiators includes a subtracter having a subtrahend input, a minuend input and an output, the minuend input of each subtracter connected to the input of the respective differentiator, the subtrahend input of each subtracter connected to the output of the respective delay element in the differentiator, and the output of each subtracter connected to the output of the differentiator.

* * * * *